United States Patent [19]

Iwadate et al.

[11] Patent Number: 4,820,609
[45] Date of Patent: Apr. 11, 1989

[54] HIGHLY SENSITIVE POSITIVE RESIST MIXTURE

[75] Inventors: Kazumi Iwadate, Higashimurayama; Katsuhiro Harada, Tokyo, both of Japan

[73] Assignee: Nippon Telegraph and Telephone Corporation, Tokyo, Japan

[21] Appl. No.: 67,263

[22] Filed: Jun. 25, 1987

Related U.S. Application Data

[62] Division of Ser. No. 847,907, filed as PCT JP85/00411 on Jul. 22, 1985, published as WO86/01009 on Feb. 13, 1986, Pat. No. 4,699,870.

[30] Foreign Application Priority Data

Jul. 23, 1984 [JP] Japan .................. 59-151269
Aug. 27, 1984 [JP] Japan .................. 59-176851
Jul. 10, 1985 [JP] Japan .................. 60-151860

[51] Int. Cl.⁴ .................. G03C 1/495
[52] U.S. Cl. .................. 430/270; 525/330.2; 525/366; 525/368; 525/372; 525/370; 525/367; 525/371
[58] Field of Search .................. 430/270; 525/330.2, 525/366, 368, 372, 370, 367, 371

[56] References Cited

U.S. PATENT DOCUMENTS

| | | | |
|---|---|---|---|
| 3,493,550 | 2/1970 | Schmitt et al. | 525/368 X |
| 3,658,534 | 4/1972 | Ishitani et al. | 430/270 |
| 3,740,366 | 6/1973 | Sanderson et al. | 525/370 X |
| 3,984,582 | 10/1976 | Feder et al. | 430/270 X |
| 4,024,293 | 5/1977 | Hatzakis | 430/5 |
| 4,156,745 | 5/1979 | Hatzakis et al. | 430/296 |
| 4,330,614 | 5/1982 | Moyer et al. | 430/325 |

FOREIGN PATENT DOCUMENTS 0081114 7/1978 Japan .................. 430/270
0106536 6/1983 Japan .................. 430/270

Primary Examiner—Paul R. Michl
Assistant Examiner—Cynthia Hamilton
Attorney, Agent, or Firm—Frishauf, Holtz, Goodman & Woodward

[57] ABSTRACT

A highly sensitive positive resist mixture which comprises a resist having a carboxyl group at the side chain and which is decomposable by high energy rays constituted by a polymer having the formula I

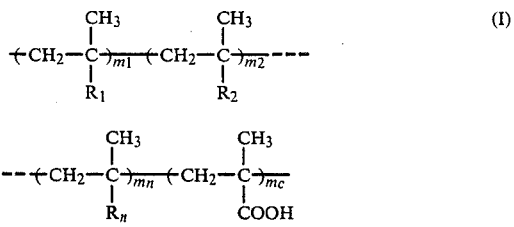

where $R_1, R_2, \ldots R_n$ represent alkyl groups, halogenated alkyl groups, or aryl groups having five or fewer carbon atoms, or —COORa or —CORb (where Ra and Rb are alkyl groups or halogenated alkyl or aryl groups having five or fewer carbon atoms), and when $$M = \left( \sum_{i=1}^{n} m_i + m_c \right),$$

$m_c/M$ is in the range of 0.01 to 1.0 and $m_1/M$, $m_2/M$, ... $m_n/M$ are respectively in the range of 0.99 to 0, and an additive selected from the group consisting of oxides, halides and organic acid salts of bivalent metals.

6 Claims, 5 Drawing Sheets

HIGHLY SENSITIVE POSITIVE RESIST MIXTURE

This is a division of application Ser. No. 847,907 filed as PCT/JP85/00411 on Jul. 22, 1985, published as WO86/01009 on Feb. 13, 1986, now U.S. Pat. No. 4,699,870.

TECHNICAL FIELD

The present invention relates to a patterning method for use in the manufacture of semiconductor integrated circuits, optical integrated circuits, Josephson devices and so forth.

BACKGROUND ART

With the improvement of the integration density and performance of semiconductor integrated circuits and so on, there has been a growing demand for a microfabrication technique for a semiconductor substrate or the like. In particular, for obtaining a predetermined pattern on a substrate or thin film of an insulator, semiconductor or metal, a photoetching technique which removes an unnecessary part by an optical or chemical method is important and is now attracting attention as the microfabrication technique.

But, when imaging is performed through use of ultraviolet radiation for microfabrication in the order of submicrons, its wavelength is so long that it is impossible to prevent image lines from "defocusing" which is caused by the diffraction or reflection of light in a mask transfer process.

In recent years, there has been developed, with a view to achieving ultra-microfabrication, an exposure system which utilizes an electron beam or soft X-rays of a shorter wavelength than the ultraviolet rays. The development of such an exposure system and improvement in a dry etching system which produces an appreciable undercut of a resist material together have made possible ultra-microfabrication in the order of submicrons.

The sensitivity of positive resist, which is a sort of resist, increases with an increase in the G-value used as a measure of the solubility of a main chain and an increase in the ratio between the solubility rates of irradiated and unirradiated parts of the resist during development that is, an increase in the selective solubility of the resist itself.

Now, consider a benzene ring-containing polymer. This kind of resist is highly resistant to dry etching but since its G-value is small, it is difficult to achieve high sensitivity. It is considered, however, that if the abovesaid selective solubility could be enhanced by some method, a positive electron resist could be obtained which is excellent in the resistance to dry etching and high in sensitivity.

A cross-linking method has been known as one of techniques for improving the selective solubility. This method is one that coats straight-chain high molecules on a substrate and then heat treats the coating to create intermolecular crosslinks, whereby the positive resist forms a resist film which is insoluble in a solvent. The positive resist of this kind, even after having been irradiated by an electron beam or X-rays, retains the cross-linking structure in the unirradiated part, so that even if a strong developing solvent is used, the unirradiated part will not undergo any swelling or deformation. With the strong developing solvent, since the irradiated part slightly decomposed by a very small amount of irradiation is also dissolved, high sensitivity can be achieved.

The known cross-linking type positive resist can be roughly divided into the following four kinds according to the type of thermal cross-linking reaction (the following reaction formulae being given noting only functionality groups of polymer side chains).

[1]

(See U.S. Pat. No. 3,981,985)

[2]

(See U.S. Pat. No. 4,061,832)

[3]

(where R represents $-(CH_3)_3$ or $-CH_2CCl_3$.)
(See U.S. Pat. No. 4,264,715)

[4]

(See K. Harada et al., "Poly(Phenyl Methacrylate-Co-Methacrylic Acid) as a Dry-Etching Durable Positive Electron Resist", IEEE Ed-29 (4) p 518 (1982))

Usually these thermally cross-linkable functional groups are located in the same polymer molecules through copolymerization or in dissimilar polymer molecules through mixture of dissimilar polymers. However, since the thermal crosslink density varies with the content of such functional groups and the heat treatment temperature, their accurate control is needed for obtaining sensitivity of excellent reproducibility after development.

Especially, in the case where it is necessary, for the purpose of increasing the dry etching resistance of the resist, to mix therein a monomer unit containing the benzene ring, the resulting resist material is a ternary copolymer which contains a third monomer unit in addition to two monomer units necessary for causing the abovesaid thermal cross-linking reaction. Hence it is very difficult to control the composition of the copolymer. Furthermore, in the case of utilizing the reaction mentioned above in [4], a high-temperature heat treatment of about 200° C. is required, so that especially when the structure to be worked is made of aluminum or the like, hillock grows, resulting in the device characteristics being degraded.

As described above in detail, ultra-microfabrication techniques in the order of submicrons are required with the advancement of the integration density and performance of semiconductor integrated circuits; to meet such a requirement, an electron beam or soft X-ray exposure process and an electron resist material have been developed for imaging a predetermined pattern on the substrate. Moreover, a dry etching process such as plasma etching has recently come into wide use as a precision etching process of limited undercut, while at the same time such advances in the dry etching technique have now called for development of an electron resist material of high dry etching resistance.

At present, however, no particular positive resist is available which is markedly effective for dry etching as referred to above; so there is much left to improve.

On the other hand, as described above, the increased integration density and performance of semiconductor integrated circuits inevitably necessitates ultramicrofabrication in the domain of submicrons; to fulfil such a requirement, there have been developed the exposure techniques using an electron beam or soft X-rays and the electron resist material. In the case of forming a resist pattern on a substrate through use of these techniques and materials, it is important to control the cross-sectional configuration of the resist pattern as well as to microminiaturize the resist pattern itself.

A conventional patterning method utilizes a lift-off process for obtaining a desired pattern without involving the etching of the material to be worked, in the manufacture of an LSI (large scale integrated circuit) or the like. With this method, a material sensitive to an electron beam, light, or soft X-rays is exposed thereto and then developed to form a desired undercut cross-sectional configuration. After the material to be worked is deposited by evaporation or some other method using the pattern as a mask, the mask forming material is removed, obtaining a desired pattern. This method necessitates the formation of the undercut cross-sectional configuration for removing the material forming the mask.

On the other hand, it has been proposed to taper the cross-sectional configuration of the resist pattern which is employed as a mask in the case of making a tapered contact hole through etching for the purpose of preventing the breakage of an interconnection material.

Such an undercut or tapered cross-sectional configuration can be obtained by forming a plurality of layers of positive resists of different solubility rates in the same developer.

The following methods have heretofore been utilized for controlling such a cross-sectional configuration as mentioned above.

Figure 1:
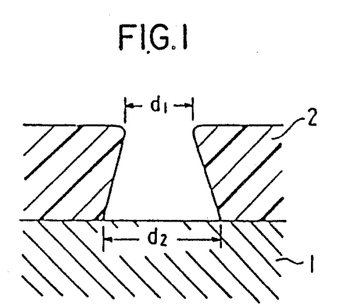
FIGS. 1 and 2 are schematic cross-sectional views, each illustrating the principal part of a resist pattern, for explaining a conventional patterning method.

(1) A first method makes use of excessive irradiation of a single layer of positive resist by an electron beam, light or X-rays, or excessive development of the layer by which the shape of the cross section of a resist pattern 2 formed on a substrate 1 becomes such a so-called undercut shape that a foot width $d_2$ is larger than an aperture width $d_1$, as depicted in FIG. 1. This method is simple but is attended with difficulty in controlling the dimensions and cross-sectional configuration of the resist pattern, that is, the aperture width $d_1$ and the foot width $d_2$. In particular, a fine aperture width $d_1$ is difficult to obtain.

Figure 2:
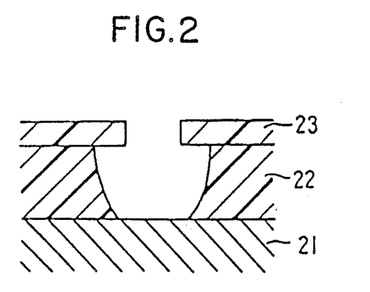

(2) A second method employs positive resists of different solubility rates for the same developer and obtains a pattern of such a cross section as shown in FIG. 2 by forming a two-layer structure with the lower layer built up from a resist of the higher solubility rate and the upper layer from a resist of the lower solubility rate. In FIG. 2, an underlying resist pattern 22 of the higher solubility rate and an overlying resist pattern 23 of the lower solubility rate are formed on a substrate 21. With method, however, when the ratio in the solubility rate between the upper and lower layers is small, dissolution of the upper resist pattern 23 proceeds in the course of dissolution of the lower resist pattern 22, introducing difficulties in obtaining a fine aperture width and in controlling the cross-sectional configuration as is the case with the method described above in (1).

With the method (2) it is also possible to laminate layers of resists of different molecular weights through utilization of the phenomenon that the solubility rate of a resist generally depends upon its molecular weight. In this instance, however, the molecular weight ratio that is feasible is limited and the underlying resist layer is readily dissolved during coating of the overlying resist layer, making it difficult to form, as a unitary structure, two layers of largely different solubility rates.

Furthermore, by reversing the relationship between the solubility rates of the underlying resist layer and the overlying resist layer formed on the substrate in the case of FIG. 2, that is, by selecting the solubility rate of the upper resist layer higher than the solubility rate of the lower resist layer, it is possible to obtain an upwardly tapered cross-sectional configuration. Also in this case, it is necessary, for easy control of the cross-sectional configuration, that the ratio between the solubility rates of the overlying and underlying layers.

It is therefore a first object of the present invention to provide a novel high-sensitivity positive resist mixture which obviates such defects of the conventional positive resists as described above and a patterning method which employs the novel positive resist mixture.

A second object of the present invention is to develop a developing method suitable for development of the novel positive resist mixture and a patterning method which employs the developing method.

A third object of the present invention is to provide a patterning method which employs the novel positive resist mixture and permits the formation of a fine pattern and at the same time high-precision control of its cross-sectional configuration.

DISCLOSURE OF THE INVENTION

As a result of their various studies and researches made in an attempt to overcome the abovesaid shortcomings of the prior art positive resists, the present inventors have found it very effective, for attaining the above objective, to utilize intermolecular crosslinking which results from the formation of Ionomer by a carboxyl group and bivalent metal ions, and have completed the present invention.

The positive resist mixture of the present invention is one that is coated on a substrate, baked, exposed and then developed to form a predetermined pattern. This positive resist mixture is characterized in that it is homogeneous mixture of a resist which has a carboxyl group at the side chain and is decomposed by the irradiation of high-energy rays and at least one additive which is selected from the group consisting of oxides, halides and organic acid salts of bivalent metals.

As the resist which has a carboxyl group at the side chain and is decomposed by high-energy rays, for example, ultraviolet rays, an electron beam, or X-rays, —useful in the positive resist mixture of the present invention, polymers which are expressed by the following general formula (I) can be exemplified.

In the above general formula (I), $R_1, R_2, \ldots R_n$ represent alkyl groups, halogenated alkyl groups or aryl groups having five or fewer carbon atoms, or —COORa or —CORb (where Ra and Rb are alkyl groups or halogenated alkyl or aryl groups having five or fewer carbon atoms). When $$M = \left( \sum_{i=1}^{n} m_i + m_c \right),$$

$m_c/M$ is in the range of 0.01 to 1.0 and $m_1/M$, $m_2/M$, ... and $m_n/M$ are respectively in the range of 0.9 to 0.

Typical examples of such a polymer useful in the positive resist mixture are poly(methylmethacrylate-co-methacrylic acid), poly(butyl methacrylate-co-methacrylic acid), poly(hexafluorobutyl methacrylate-co-methacrylic acid), poly(isobutylene-co-methacrylic acid), poly(methacrylonitrile-co-methacrylic acid), poly(phenyl methacrylate-co-methacrylic acid), poly($\beta$-naphthyl methacrylate-co-methacrylic acid) and so forth. But the polymer for use in the present invention is not limited specifically to them.

Moreover, additives useful for the positive resist mixture are BaO as the bivalent oxide, bivalent chlorides, bromides and iodides of Cu, Ca, Ba, Zn and Fe as the halogenated metals and bivalent formates, acetates and propionates of Cu, Ca, Ba and Zn as the organic acid salts of bivalent metals.

However, the additive is not limited specifically to them and will produce the same effects as obtainable with them so long as it is able to form Ionomer through heat treatment in cooperation with the resist which has the carboxyl group at the side chain and is decomposed through irradiation by high-energy rays.

The amount of the additive added in the mixture somewhat varies with the amount of the methacrylic acid component in the resist and with the heat treatment temperature; usually the addition of the additive in the range of from 0.1 to 5 wt% will achieve an excellent effect.

It has already been known in the art that heating of the polymer having the carboxyl group at the side chain, with an oxide or organic acid salt of a bivalent metal, causes bridging of ions to form Ionomer ("The Fundamentals of Polymer Chemistry", pp. 304 (1978), edited by Society of Polymer Science, Japan, published by Tokyo Kagaku Dojinsha). The positive resist of the present invention performs crosslinking by such an Ionomer forming reaction.

The positive resist of the present invention is a mixture of a resist material and an additive, as repeatedly referred to above, and it is used in such a manner as mentioned below.

At first, the positive resist is dissolved or dispersed in a suitable solvent and then coated on a substrate by a known spin coating, spray or vapor phase coating method. It is also preferable that prior to the resist coating, the substrate be heat treated or cleaned, as required, to remove absorbates from the substrate surface for improving the adhesion of the resist to the substrate.

The resist thus coated on the substrate is then baked as usual, by which the solvent in the coated film is removed. Next, patterns of the preceding step and the subsequent step are positioned relative to each other. For this positioning, positions of reference marks put on the substrate in advance are detected by scanning with an electron beam or the like, or in the case of X-ray exposure using a mask, marks on the mask and the substrate are optically detected through use of a microscope. After this treatment the coated film is subjected to exposure to irradiation by high-energy rays, for instance, an electron beam, X-rays or ultraviolet rays.

The patterning by the abovesaid exposure is followed by development through use of a suitable solvent or proper combination of such solvents, for example, a solvent mixture of 1,4-dioxane which is a good solvent and diisobutyl ketone which is a poor solvent. By mixing such solvents in a ratio at which the unirradiated part of the coated film exhibits the highest solvent resistance, as described later, it is possible to markedly raise the sensitivity of the resist pattern. As the developer for use in the present invention, various other solvent mixtures such, for example, as those in which hexane, cyclohexane or the like is substituted for diisobutyl ketone in the above solvent mixture can be employed.

The resist thus developed is subjected to post baking treatment, thereby removing the organic solvent or the like remaining on the resist and the substrate and improving the adhesion of the resist to the substrate. Next, the substrate is subjected to etching, after which the resist film is removed. Th removal of the resist film can be achieved by conventionally known methods, for example, a plasma ashing process and a wet method using liquid chemicals. Usually the wet method is employed for the removal of the resist film in the lift-off process.

Thus, by selecting the carboxyl group content, i.e. $m_c/M$, in the polymer as the resist component in a specified range and the amount of the additive in a predetermined range, the positive resist mixture of the present invention can be made extremely suitable for ultramicrofabrication and is free from the various defects of the conventional positive resists. With this positive resist mixture, even if an electron beam, X-rays or the like is used for exposure, the unirradiated part will retain the cross-linking structure (as Ionomer), and even if a strong developing solvent is employed, the unirradiated part will be neither swollen nor deformed nor dissolved, besides even a part slightly decomposed by a very small amount of exposure will be dissolved; so extremely high sensitivity can be achieved. Furthermore, as will be seen from the aforementioned equation (I), since monomer units of various characteristics, for example, the dry etching resistance, can be introduced as binary or ternary copolymers, resists of various characteristics can easily be obtained.

With the above positive resist mixture which consists of a polymer having the carboxyl group at the side chain to which is added an oxide, halide, or organic acid salt of the bivalent metal, since the Ionomer that serves as the ion bridge is formed, by heating, to create thermal crosslinks, the density of intermolecular crosslinks can be controlled through the concentration of the additive and the heat treatment temperature.

Accordingly, a pattern of a desired cross section could be obtained by forming the coated resist pattern layer by heat treating and coating, in layers, positive resist mixtures of different additive concentrations, each of which is a mixture of a resist having the carboxyl group at the side chain and an additive selected from the group consisting of oxides, halides and organic acid salts of bivalent metals, or by heat treating positive resist mixtures of the same additive concentration at different temperatures and coating them in layers, by exposing the pattern layer to irradiation by the abovesaid high-energy rays, and then by developing the layer to form the pattern.

The present invention is intended to improve, based upon the above findings, the patterning method according to which pattern forming materials of different solubility rates in the same developer are coated in at least two layers on a substrate to provide thereon a pattern forming layer, which is irradiated by high-energy rays and then developed to thereby form a pattern. That is, the invention offers a patterning method which is characterized in that a positive resist mixture, which consists of a homogeneous mixture of a resist having the carboxyl group at the side chain and an additive selected from the group consisting of oxide, halides, and organic acid salts of bivalent metals, is used as the pattern forming material, and in that the pattern forming material layer obtained by coating such positive resist mixtures of different additive concentrations after heat treatment, or positive resist mixtures of the same additive concentration after heat treatment at different temperatures, is exposed to irradiation by the high-energy rays and then subjected to development, thereby forming the pattern.

In the above patterning process, the positive resist mixture layer after exposure is developed using a developer in which 1,4-dioxane which is a good solvent and diisobutyl ketone which is a poor solvent are mixed in a ratio at which the pattern forming film exhibits the highest solvent resistance. As mentioned previously, the developer is not limited specifically to the above but various other developers can equally be employed; for instance, it is also possible to substitute the diisobutyl ketone in the above mixed solution with hexane, cyclohexane, or the like.

With the development by the abovesaid mixed solution, however, for example, when the blending ratio of the additive in the positive resist mixture of the present invention is high, the irradiated part of the film may sometimes remain unremoved or edges of the pattern may be formed dull in some cases.

Figure 7:
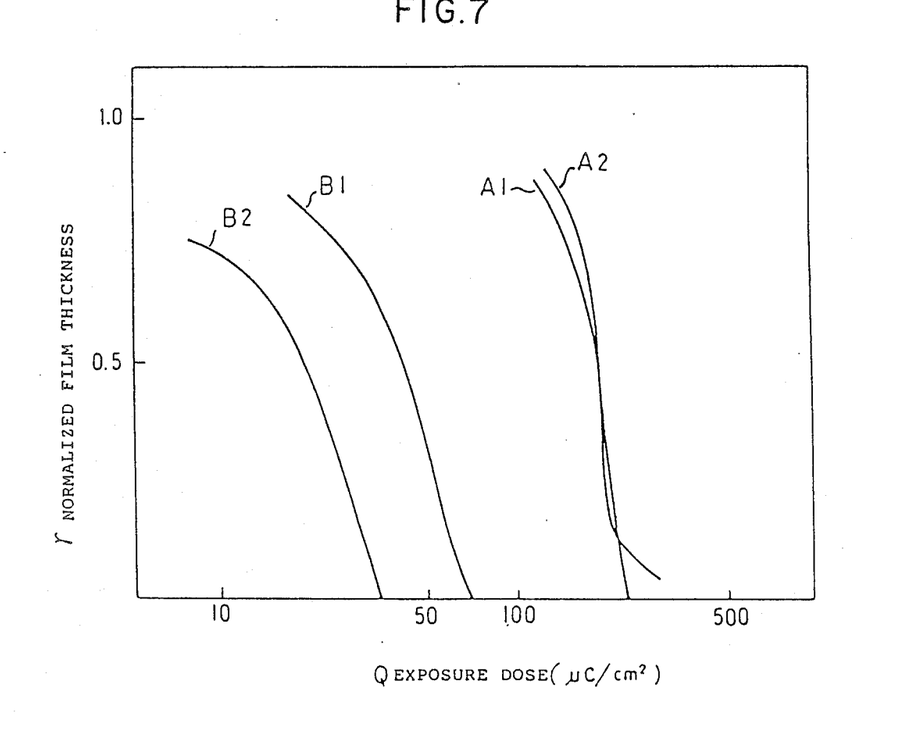
FIG. 7 is a graph showing sensitivity curves of the $\phi$-MAC in the cases of using different developers according to embodiments of the present invention.

For instance, FIG. 7 shows sensitivity curves obtained when pattern forming material layers of positive resist mixtures employing a phenyl methacrylate-co-methacrylic acid copolymer ($\phi$-MAC) were developed. In FIG. 7, there are shown sensitivity curves (indicated by B2 and A2) obtained in the cases where positive resist mixtures, which are composed of the $\phi$-MAC positive resist and zinc bromide added in concentrations of 0 and 3 wt% (relative to the resist), were heat treated at 200° C., irradiated by an electron beam of a 30 KV accelerating voltage, and developed by using, as the developer, a mixed solution of 1,4-dioxane and diisobutyl ketone in a volume ratio of 30:70. In FIG. 7, the abscissa Q represents the amount of irradiation by the electron beam ($\mu C/cm^2$) and the ordinate r the film remaining rate of each of the $\phi$-MAC film and the $ZnBr_2$ added $\phi$-MAC film. In either case, the initial film thickness is 0.5 $\mu m$ and the developing time 70 seconds. In the case of the curve A2 corresponding to the film added with the zinc bromide in the concentration of 3 wt%, the sensitivity curve tails, indicating that a thin skin like film remains unremoved. On the other hand, in the case where the concentration of addition of the zinc bromide is 0 wt%, that is, in the case of the curve B2 corresponding to the $\phi$-MAC film with no additive, the sensitivity curve does not tail.

As described above, in the pattern forming process employing the positive resist mixture which is a homogeneous mixture of a resist which has the carboxyl group in the side chain and is decomposed by the high-energy irradiation and at least one additive selected from oxides, halides, or organic acid salts of bivalent metals, the use of the abovementioned developer may sometimes introduce the disadvantage that irradiated film is left remaining after development or edges of the pattern are not sharp.

In view of the above, the present invention is intended to offer a patterning method which obviates these defects and permits the formation of a fine pattern of a desired cross section, as described below.

That is, the present invention provides a patterning method which employs a developer having carboxylic acid mixed in an organic solvent, in the patterning process in which the positive resist mixture composed of a homogeneous mixture of a resist having the carboxyl group in the side chain and decomposable by the high-energy irradiation and at least one additive selected from the oxides, halide, or organic acid salts of bivalent metals, is coated on a substrate, baked, irradiated by the high-energy rays, and developed by the developer to dissolve the irradiated part of the coated film, thus forming a desired pattern.

Furthermore, the present invention provides a patterning method which is characterized in that the film to be formed by coating the positive resist mixture and baking the coated film is made up of at least two layers of different concentrations or kinds of additives and in that the developer having carboxylic acid mixed in an organic solvent and a developer with no carboxylic acid mixed in the organic solvent are each used at least once for developing the coated two-layered film.

As a result of their repeated experiments and studies on various developing methods in an attempt to solve the above-said problems, the present inventors have found that the addition of the carboxylic acid to the developer as mentioned above can overcome the defects that the irradiated film is left remaining after development and that edges of the pattern are not sharp.

The carboxylic acid mentioned herein is a generic term for organic compounds having the carboxyl group (—COOH).

It is considered that the carboxylic acid added to the developer in the present invention dissociates Ionomer bonds, promoting dissolution by the developer.

According to the present invention, it is possible to remove the thin film remaining after development, ensuring the formation of a fine pattern with sharp edges.

Besides, in the case of the coated layer of the positive resist mixture composed of the resist having the carboxyl group in the side chain and decomposable by the high-energy irradiation and added with at least one of the oxides, halides, or organic acid salts of bivalent metals, the solubility rate in the developer with no carboxylic acid and in the developer added with the carboxylic acid according to the present invention remains almost unchanged. However, in the case of the coated layer of a positive resist mixture with no additive, the solubility rate differs in the developer added with the carboxylic acid and in the developer with no carboxylic acid; the solubility rate decreases in the developer added with the carboxylic acid.

According to the present invention, it is also possible to control the cross-sectional configuration of the pattern through utilization of the above phenomenon, that is, by suitably selecting the times for development with the developer containing the carboxylic acid and the developer not containing it. This permits enlargement of the range over which the cross-sectional configuration of the pattern can be controlled.

BEST MODE FOR CARRYING OUT THE INVENTION

The patterning method of the present invention which employs the positive resist mixture will hereinafter be described more concretely with reference to its embodiments. However, the scope of the present invention will not be limited specifically to the embodiments.

EXAMPLE 1

In this example, a poly(methyl methacrylate-co-methacrylic acid) copolymer containing a 30 mol% methacrylic acid unit and having a weight average molecular weight of six hundred thousand was used as the resist having the carboxyl group in the side chain and decomposable by irradiation of the high-energy rays.

Figure 3:
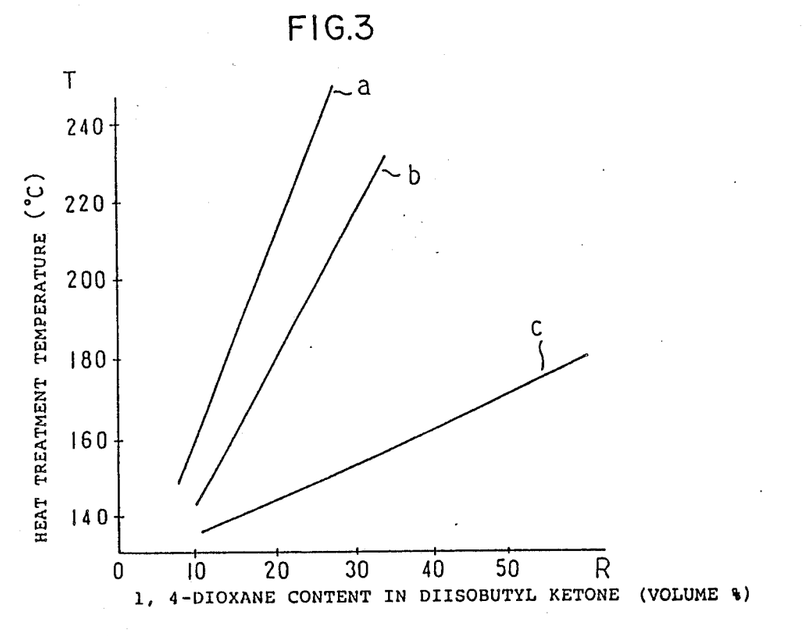
FIG. 3 is a graph showing the compositions of mixed solutions to which a film, formed by coating the positive resist of the present invention and heat treating it, exhibits the highest solvent resistance so that the film is neither dissolved nor swollen after being dipped in the mixed solvents of the compositions on the abscissa for 30 minutes and then dried, curves a, b and c indicating the cases where the amounts of the additive in the resist are 0.3, 1.0 and 3.0%, respectively.

Further, zinc bromide ($ZnBr_2$) was used as the additive selected from the oxides, halides, or organic acid salts of bivalent metals. mixtures of the resist and the additive added in the amounts of 0.3, 1.0, and 3.0 wt% relative to the former were each dissolved in a 1-1 (in volume ratio) monochlorobenzene-methyl isobutyl ketone mixture to obtain an 8% solution, which was coated by spin coating on a wafer to form thereon a film about 1 $\mu$m thick. Next, the respective samples were heat treated, for an hour, at temperatures (in °C.) shown on the ordinate T in FIG. 3, after which they were dipped, for 30 minutes, in mixed solvents (composed of 1,4-dioxane and diisobutyl ketone) of various compositions shown on the abscissa R in FIG. 3 and then dried. The thus obtained films were observed as to the extent of their dissolution, swelling, and deformation. In FIG. 3 are plotted, as the strongest solvent compositions, the mixed solvents that did not bring about these disadvantages in the case where the content of the additive and the heat treatment temperature were fixed for all samples. That is, points on each curve in FIG. 3 indicate the compositions of mixed solvents which caused dissolution, swelling, and deformation of the samples of the same additive content and heat treatment temperature less than the other mixed solvents. In this instance, the 1,4-dioxane is a good solvent and the diisobutyl ketone a poor solvent. The more of the former, the stronger the mixed solvent. From the experimental results shown in FIG. 3 it appears that the larger the amount of zinc bromide and the higher the heat treatment temperature, the moe the Ionomer forming reaction proceeds, increasing the crosslink density to provide for higher solvent resistance of the resist mixture. In FIG. 3 the curves a, b, and c correspond to the resists added with the additive in the amounts of 0.3%, 1.0%, and 3.0%, respectively.

Thus, FIG. 3 shows also developer compositions for the positive resist mixture composed of the resist and the additive according to this example. That is, a high sensitivity positive resist can be obtained by selecting the developer of the strongest solvent composition—obtainable from the additive contents and the heat treatment temperatures in FIG. 3—which will not cause dissolution, swelling, and deformation of the film of the positive resist mixture.

EXAMPLE 2

The same resist mixtures of the present invention as in Example 1 were used. The resist mixtures were coated 0.5 $\mu$m thick on silicon wafers and heat treated, after which the samples were irradiated at different dosages, by an electron beam printer of a 20 KV accelerating voltage, and then developed. Table 1 shows, in terms of the electron beam sensitivity of each sample, the dosage at the point when the remaining film of the sample disappeared after development.

TABLE 1

Resist Characteristics of the Resist Mixtures of the Present Invention in Terms of Electron Beam Sensitivity

| Amount of Zinc Bromide Added (wt %) | Heat Treatment Temperature (°C.) | Developer Composition* DX/DBK (volume %) | Electron Beam Sensitivity ($\mu C/cm^2$) |
|---|---|---|---|
| 3 | 160 | 40/60 | 21 |
| 3 | 140 | 15/85 | 12 |
| 1 | 200 | 25/75 | 8 |
| 1 | 160 | 15/85 | 5 |
| 0.3 | 200 | 17.5/82.5 | 10 |
| 0.3 | 160 | 10/90 | 9 |
| 0** | 200 | 5/95 | 18 |

*DX: 1,4-dioxane
DBX: diisobutyl ketone
**Comparison example

Because of varying degrees of thermal crosslinking of the samples, the developing times were adjusted so as to prevent lowering of their resolution. As a result of this, a resist mixture of the highest sensitivity could be obtained by optimizing the amount of the additive, the heat treatment temperature, and the developer composition. As will be appreciated from Table 1, in the case of the resist which does not contain the additive according to the present invention, although it is heat treated at 200° C., no thermal crosslinking occurs and even if it is developed with a weak developer, the nonirradiated part is dissolved and swollen, so that high sensitivity cannot be achieved.

EXAMPLE 3

In this example, a check was made to determine what effects would be produced by different kinds of resists, each having the carboxyl group in the side chain and decomposable by the high-energy ray irradiation. The electron beam sensitivity was obtained in the same manner as in Example 2. The additive used was zinc bromide and the esolvents used were properly selected from those for dissolving the respective resists. The results are given below in Table 2.

TABLE 2

Resist Characteristics of Resist Mixtures of the Present Invention in Terms of Electron Beam Sensitivity
(Additive: zinc bromide, Amount of addition: 1 wt % relative to the resist, Heat treatment temperature: 160° C., Developer composition: 1,4-dioxane/diisobutyl ketone = 15/85)

| Kind of Resist* | Composition of methacrylic acid (mol %) | Electron beam Sensitivity ($\mu C/cm^2$) |
|---|---|---|
| Poly(butyl MA-MAAc) | 30 | 9 |
| Poly(hexafluorobutyl MA-MAAc) | 5 | 2 |
| Poly(isobutylene-MAAc) | 20 | 5 |
| Poly(methacrylonitrile-MAAc) | 10 | 13 |
| Poly(phenyl MA-MAAc) | 30 | 23 |
| Poly($\beta$-naphtyl MA-MAAc) | 30 | 25 |

*MA: methacrylate
MAAc: methacrylic acid

The development characteristic of the resist mixture of the present invention depends mainly upon the methacrylic acid content, the additive content and the heat treatment temperature. Accordingly, the resist of the present invention permits easy introduction thereinto of second and third monomer units copolymerizable with methacrylic acid, and hence is characterized by a wide range over which the molecular structure of the resist can be selected. The poly(hexafluorobutyl MA-MAAc) and the poly(isobutylene MAAc) in Table 2 are each a copolymer of a monomer unit easily decomposable by the high-energy ray irradiation and methacrylic acid. The poly(phenyl MA-MAAc) and the poly($\beta$-naphtyl MA-MAAc) are each a copolymer of a monomer unit having an aryl group and a high dry etching resistance and methacrylic acid.

EXAMPLE 4

In this example, a check was made to determine what effects would be produced by different kinds of additives selected from the oxides, halides, or organic acid salts of bivalent metals. The electron beam sensitivity was obtained in the same manner as in Example 2. A proper solvent for coating use was selected from those capable of dissolving the respective additives and the resist. The results are given below in Table 3.

TABLE 3

Resist Characteristics of Resist Mixtures of the Present Invention in Terms of Electron Beam Sensitivity
(Resist: poly(methyl methacrylate-co-methacrylic acid), Methacrylic acid content: 30 mol %, Heat Treatment temperature: 180° C., Developer composition: 1,4-dioxane/diisobutyl ketone = 20/80)

| Additive | Amount added (wt %) | Electron beam sensitivity ($\mu C/cm^2$) |
|---|---|---|
| BaO | 0.7 | 10 |
| $CuCl_2$ | 0.4 | 13 |
| $ZnI_2$ | 1.4 | 11 |
| Calcium formate | 0.6 | 8 |
| Barium acetate | 1.3 | 6 |
| Zinc propionate | 1.8 | 12 |

The additive for achieving the effect intended by the present invention needs only to be a material which, when heat treated, forms Ionomer in cooperation with the resist having the carboxyl group in the side chain.

As described above, according to the present invention, since the intermolecular crosslink density of the resist mixture can be controlled through suitable selections of its additive concentration and heat treatment temperature, different sensitivities can be achieved for the same resist. Moreover, since the resist, when heat treated, becomes insoluble in the solvent, the same resist of different additive concentration can be coated in layers. This is effective for patterning which requires control of the cross-sectional profile of the resist pattern after development. Besides, the use of the monomer unit that is copolymerizable with methacrylic acid makes possible the selection of the molecular structure of the resist over a wide range. This allows ease in achieving the capabilities of the resist that are needed for the formation of a fine pattern, such as the dry etching resistance and the adhesion to the substrate.

EXAMPLE 5

Figure 4:
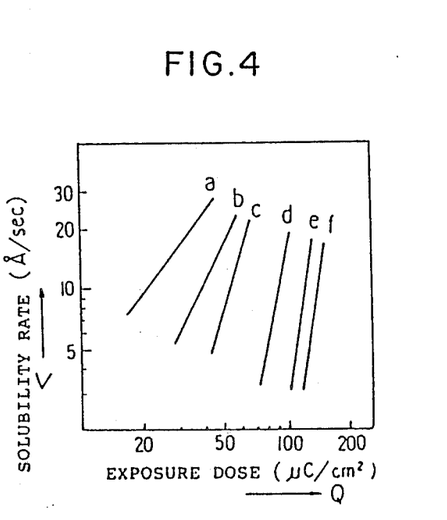
FIG. 4 is a graph showing the solubility rate of the $\phi$-MAC material relative to the concentration of zinc bromide added (in wt% relative to the resist) and the heart treatment temperature (in °C.)

FIG. 4 shows variations in the solubility rate of a positive resist composed of a phenyl methacrylate-co-methacrylic acid copolymer ($\phi$-MAC) and added with zinc bromide, in accordance with the additive concentration (in wt% relative to the resist) and the heat treatment temperature. The abscissa Q represents the exposure dose by an electron beam (in $\mu C/cm^2$) and the ordinate V the solubility rate of the $\phi$-MAC (in Å/sec.) The developer used is composed of 1,4-dioxane and diisobutyl ketone in the ratio of 30 to 70 (in the volume ratio). The gradient of each straight line in FIG. 4, i.e. the changing ratio rate of the solubility rate to the amount of irradiation, indexes resolution of the resist; the higher the changing ratio, the higher the resolution. In FIG. 4, a indicates the case where the concentration of zinc bromide added is 0 wt% and the heat treatment temperature is 200° C., b the case where the concentration of the zinc bromide added is 1 wt% and the heat treatment temperature is 180° C., c the case where the concentration of zinc bromide added is 1 wt% and the heat treatment temperature is 200° C., d the case where the concentration of zinc bromide added is 3 wt% and the heat treatment temperature is 160° C., e the case where the concentration of zinc bromide added is 3 wt% and the heat treatment temperature is 180° C., and f the case where the concentration of zinc bromide added is 3 wt% and the heat treatment temperature is 200° C. According to the experimental results shown, the more the amount of zinc bromide added increases and the higher the heat treatment temperature rises, the more the intermolecular crosslink density increases and the solubility rate decreases, but the changing ratio of the solubility rate becomes greater.

Figure 5:
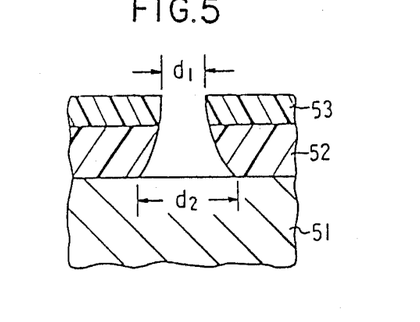
FIGS. 5 and 6 are each a cross-sectional view of the principal part of a resist pattern, illustrating an embodiment of the present invention.

Next, a description will be given, with reference to FIG. 5, of a more specific embodiment of the invention.

A φ-MAC resist with no additive was spin-coated on a substrate 51 and then heat treated at 200° C., that is, prebaked (see a in FIG. 4). This underlying resist layer 52 was 4000 Å thick. The solvent used for coating was a mixed solution of 50% monochlorobenzene and 50% dioxane (in volume ratio). Next, a φ-MAC resist added with 3 wt% of zinc bromide was spin-coated on the sample and prebaked at 180° C. (e in FIG. 4). The overlying resist layer 53 thus coated was 3000 Å, and the solvent used for coating is methylisobutyl ketone. An electron beam of a 30 KV accelerating voltage was applied to the sample to scan it in a line 0.3 μm wide. The exposure dose was 260 μC/cm$^2$.

Next, the sample was developed by dipping in a mixed solution of 30% dioxane and 70% diisobutyl ketone, by which was formed a pattern made up of patterns of the underlying and overlying resist layers 52 and 53 and having a 0.4 μm aperture width $d_1$ and a 1 μm foot width $d_2$, that is, having an undercut cross-sectional profile. By using this pattern for lifting off aluminum, a 0.4 μm wide line pattern of aluminum was obtained.

EXAMPLE 6

Next, another embodiment of the present invention will be described with reference to FIG. 6. In the above embodiment the underlying layer was formed of the resist of the higher solubility rate, but in this embodiment the underlying layer 62 was formed of the resist of the lower solubility rate and the overlying layer 63 the resist of the higher solubility rate.

A φ-MAC resist added with 1 wt% of zinc bromide was spin-coated on a substrate 61 and then prebaked at 200° C. (c in FIG. 4). The coated film was 3000 Å thick. The solvent used for coating was a mixed solution of 50% monochlorobenzene and 50% dioxane. A φ-MAC resist with no additive was spin-coated on the above coated film and then prebaked at 200° C. (a in FIG. 4). This coated film was also 3000 Å. The solvent used for coating was methylisobutyl ketone. Next, an electron beam of a 30 KV accelerating voltage was applied to the sample to scan it in a line 0.3 μm wide. The amount of irradiation was 200 μm/cm$^2$. Next, the sample was developed by dipping in a mixed solution of 30% dioxane and 70% diisobutyl ketone, by which was obtained an overcut cross-sectional profile with a 1 μm aperture width and a 0.4 μm foot width. While in this embodiment the phenyl methacrylate-co-methacrylic acid copolymer (φ-MAC) was used as the positive resist material, it is also possible to use other materials which have the carboxyl group in the side chain. Further, although zinc bromide was used as the additive, other additives can also be employed which are selected from oxides, halides, or organic acid salts of bivalent metals. Moreover, in this embodiment the positive resist mixtures of different additive concentrations were coated in layers after heat treatment, but it is evident from FIG. 4 that positive resist mixtures of the same additive concentration may also be coated in layers after heat treatment at different temperatures.

With the two-layer structure in which the underlying and overlying layers are formed of resists of higher and lower solubility rates, respectively, a pattern of an undercut cross-sectional profile can be obtained as described above; so this structure can be applied to the formation of a fine lift-off pattern. In contrast thereto, in the case of the structure in which the underlying and overlying layers are formed of resists of lower and higher solubility rates, respectively, a pattern of an overcut cross-sectional profile. So, by selectively removing a material to be worked, through the dry etching process using the pattern as a mask on the condition that the resist material and the material to be worked are substantially equal in etching rate, a tapered contact hole of a shape similar to that of the pattern shown in FIG. 6 can be formed, preventing breakage of an interconnection material.

As described above, according to the present invention, when heat treated, the positive resist mixture, which is a homogeneous mixture (a mixture in which an additive is homogeneously distributed) of the resist having the carboxyl group in the side chain and the additive selected from at least one of the oxides, halides, or organic acid salts of bivalent metals, forms Ionomer to produce thermal crosslinks, so that the crosslink density can be controlled by selecting the amount of the additive and the heat treatment temperature. Accordingly, the cross-sectional profile of the resist pattern can be controlled by laminating layers of such positive resist mixtures of different additive concentrations. Besides, since control of the solubility rate by the addition of the additive is easy and the amount of control is large, it is possible to obtain a multilayer resist structure in which the ratio between the solubility rates of the overlying and underlying layers is great, and the cross-sectional profile of the resist pattern can be controlled over a wide range. This permits the formation of a pattern of fine dimensions. In addition, since the solvent becomes insoluble by the addition of the additive and heat treatment, resists of the same composition but different additive concentrations can be coated in layers.

Example 7

A description will be given, with reference to FIG. 7, of an improved developer of the present invention and an embodiment of the patterning process employing the improved developer. FIG. 7 shows the results of development of the positive resist mixture composed of the phenyl methacrylate-comethacrylic acid copolymer (φ-MAC) through the use of a developer containing acetic acid according to the present invention, along with the results of development by the aforementioned conventional developer. In FIG. 7, the abscissa Q represents the exposure dose by an electron beam in μC/cm$^2$ and the ordinate r the amount of remaining film of the φ-MAC resist and the φ-MAC resist added with ZnBr$_2$. The initial film thickness is 0.5 μm and the development time is 70 sec.

Shown in FIG. 7 are sensitivity curves which were obtained in the cases where positive resist mixtures in whcih positive resists, each composed of the phenyl methacrylate-comethacrylic acid copolymer, are added with zinc bromide in the amounts of 0 and 3 wt%, respectively, were baked at 200° C., irradiated by an electron beam of a 30 KV accelerating voltage, and developed by a mixed solution of 1,4-dioxane, diisobutyl ketone, and acetic acid in the (volume) ratio of 30 to 70 to 1. The sensitivity of the positive resist mixture with no additive (unadded φ-MAC) is indicated by the curve B1 and the sensitivity of the positive resist φ-MAC added with zinc bromide in the amount of 3 wt% is indicated by the curve A1. Incidentally, the chemicals used in this embodiment were all manufactured by Kanto Kagaku Kabushiki Kaisha, and 1,4-dioxane "Guaranteed Reagent", 2,6-dimenthyl-4-heptanone (diisobutyl ketone) "Extra Pure", and acetic acid "Electronic Grade" were used.

At first, comparison of the curve A1 of this embodiment and the curve A2 obtained in the case of using the conventional developer indicates that the tail of the curve A2 does not appear in the curve A1. This shows that a thin skin like film did not remain in this embodiment. The reason for this is that dissolution of the positive resist mixture was promoted by dissociation of Ionomer bonds by the acetic acid contained in the developer.

The acetic acid is added in the volume ratio of 30 to 70 to 0.5 or 30 to 70 to 10 (0.5 and 10: the acetic acid).

It is also possible to use their developers in which the diisobutyl ketone is substituted with hexane, cyclohexane, or the like, and in which the acetic acid is substituted with other carboxylic acids, for instance, formic acid, propionic acid, ethylacetic acid, or the like.

Furthermore, as shown in FIG. 7, the positive resist $\phi$-MAC added with zinc bromide in the amount of 3 wt% exhibits substantially the same sensitivity with respect to the developer of this embodiment and the conventional one (see the curves A1 and A2). On the other hand, when the additive-free positive resist mixture is developed by the developer of this embodiment (the curve B1), its sensitivity and consequently solubility rate differs from that when developed by the conventional developer (the curve B2). This means that the cross-sectional profile of a pattern can be controlled by using the developer of this embodiment and the conventional one in combination and by suitably selecting their development times; this is effective, in particular, for controlling the width of an aperture in the layer of the additive-free positive resist $\phi$-MAC in the interface with the underlying substrate.

Figure 8:
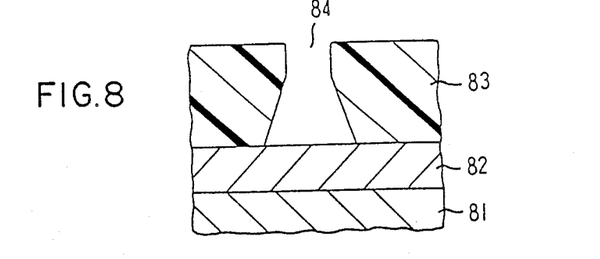
FIGS. 8 through 11 are cross-sectional views illustrating a sequence of steps involved in the manufacture of a semiconductor element through use of the lift-off technique.
Figure 9:
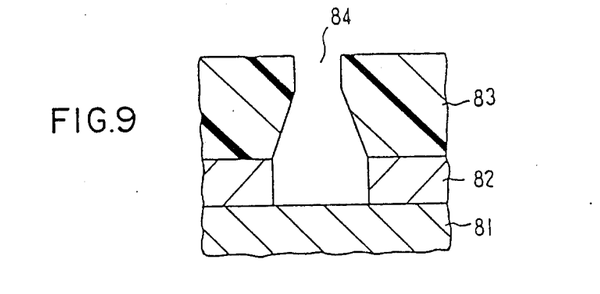
Figure 10:
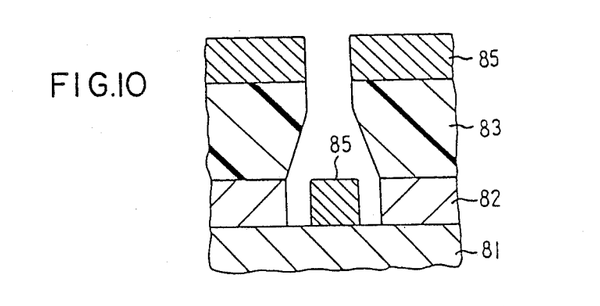
Figure 11:
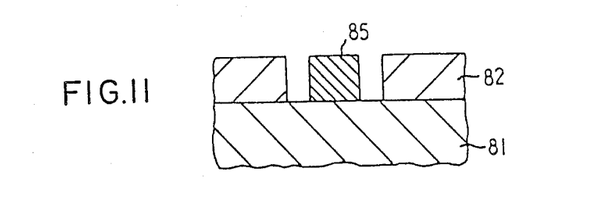

The control of the width of the aperture in the interface between the resist layer and the substrate is of importance in the formation of a semiconductor element. For example, FIGS. 8 through 11 illustrate a sequence of steps involved in the liftoff process. As depicted in FIG. 8, a thin film 82 (of metal for forming source and drain electrodes of a field effect transistor, for example) on a substrate 81 and an aperture 84 of an undercut profile in cross section is made in the resist layer 83. Then, as shown in FIG. 9, the thin film 82 is selectively etched away using the resist pattern as a mask. At this time, the thin film 82 is patterned with the same width as that of the aperture 84 in the interface with the film. Next, metal (gate metal of the field effect transistor, for instance) is vapor deposited, is indicated by 85 in FIG. 10. In this case, the metal 85 is deposited, on the substrate 81, in the form defined by width of the upper part of the aperture of the resist pattern. Thereafter, the resist layer 83 is lifted off, along with the overlying metal layer 85, providing such a structure as depicted in FIG. 11. In such an instance as mentioned above, the foot width as well as the aperture width constitute factors for determining the dimensions of the source, drain, and gate and the distances therebetween which are important for element characteristics. Therefore, control of the foot width as well as the aperture width is very important.

Figure 12:
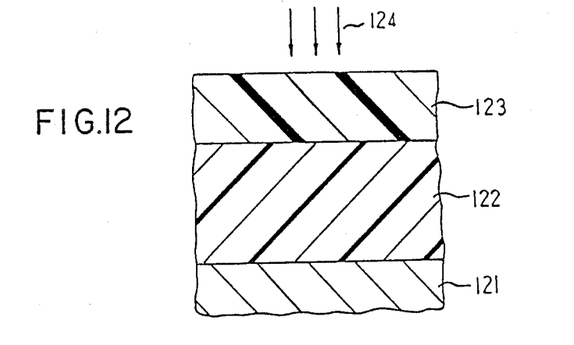
FIGS. 12 through 14 are cross-sectional views illustrating a sequence of steps involved in another embodiment of the present invention in which the resist layer is two-layered and different developers are used.
Figure 13:
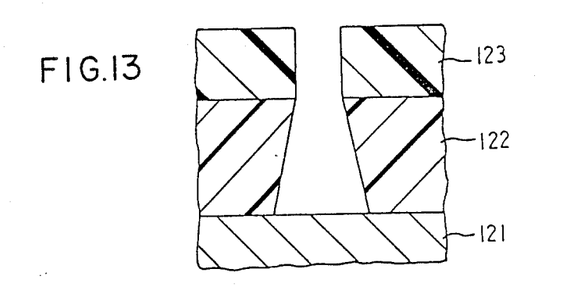
Figure 14:
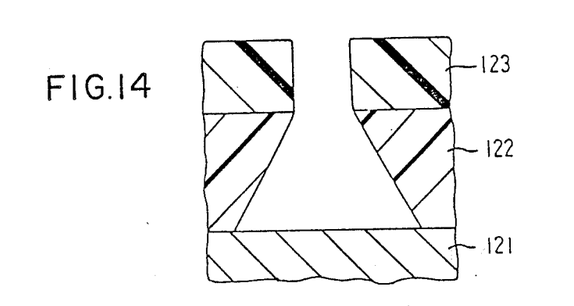

FIGS. 12 to 14 illustrate an embodiment in which the resist layer is formed as a two-layer film, taking the above into account. As depicted in FIG. 12, a layer 122 of the additive-free $\phi$-MAC and a layer 123 of the $\phi$-MAC added with $ZnBr_2$ are sequentially formed, by coating, on a substrate 121 and then the film is irradiated by an electron beam 124. Next, the film is developed by the developer added with acetic acid according to the present invention in a first development step, as depicted in FIG. 13. At this time, an aperture is sharply made in the overlying layer 123 of the $\phi$-MAC added with $ZnBr_2$, without leaving any thin films owing to the effect described previously. On the other hand, since the underlying layer 122 of the additive-free $\phi$-MAC is higher in solubility rate than the overlying layer, the aperture extending down into this layer fans out toward the substrate. With the developer added with acetic acid according to the present invention, however, a sufficient sensitivity difference between the two layers and accordingly, a sufficient difference between their solubility rates, cannot be obtained, as indicated by the curves A1 and B1. Then, the film is developed with the conventional developer with no acetic acid in a second development step, as shown in FIG. 14. In this instance, since the sensitivity difference and consequently the solubility rate difference can be made large, as in the cases of the curves A1 and B1 in FIG. 7, the aperture in the overlying layer 123 of the $\phi$-MAC added with $ZnBr_2$ does not appreciably broaden in cross section but the foot width of the aperture in the interface between the underlying layer 122 of the additive-free $\phi$-MAC and the substrate 121 can be broadened.

In the embodiment illustrated in FIGS. 12 to 14, the developer added with acetic acid according to the present invention is used first and then the conventional developer with no acetic acid, but a pattern of a similar cross-sectional profile will be formed even if the order of use of the developers is reversed. That is, even if a thin skin like film of the overlying layer 123 of the $\phi$-MAC added with $ZnBr_2$ remains when the film is developed first using the additive-free conventional developer, the developer goes around or penetrates into the remaining film, dissolving the underlying additive-free $\phi$-MAC layer 122 into a pattern of a cross section close to the desired undercut profile. Then the remaining film of the overlying layer 123 of the $\phi$-MAC added with $ZnBr_2$ is removed by the developer added with acetic acid and at the same time the underlying additive-free $\phi$-MAC layer 122 is additionally removed, thus obtaining the same cross-sectional profile as in the case of FIGS. 12 to 14.

Figure 6:
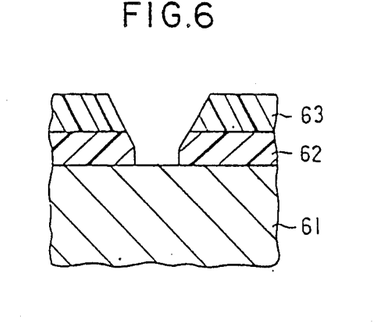

By reversing the order of the overlying and underlying resist layers in FIG. 12, that is, by forming the upper layer of the additive-free $\phi$-MAC resist and the lower layer of the $\phi$-MAC resist added with $ZnBr_2$, it is possible to obtain the tapered resist pattern depicted in FIG. 6.

Example 8

Next, a more detailed description will be given of another embodiment which employs the developer added with acetic acid.

The additive-free $\phi$-MAC resist is spin-coated on a GaAs substrate and then prebaked at 200° C. The film thickness is 5000 Å. The solvent used for coating is a mixed solution of 50% monochlorobenzene and 50% dioxane. This solvent may also be methyl cellosolve acetate. The methyl cellosolve acetate can be preserved for a long period of time and will not remain undissolved.

Next, the φ-MAC added with zinc bromide in the amount of 3 wt% is spin-coated on the above layer and prebaked at 200° C. The thickness of this overlying layer is 3000 Å. The solvent used for this coating is methylisobutyl ketone. An electron beam with a 30 KV accelerating voltage is applied to this sample with 0.3 μm scanwidth. The exposure dose was 250 μC/cm$^2$.

Next, this sample was developed, for 120 sec., with a mixed solution composed of 1,4-dioxane, diisobutyl ketone, and acetic acid in the ratio of 30 to 70 to 1, by which could be formed a pattern of an undercut cross-sectional profile 0.32 μm in the aperture width and 0.56 μm in the foot width.

Example 9

Next, a concrete embodiment which used other developer added with acetic acid will be described.

The additive-free φ-MAC resist was spin-coated on a GaAs substrate and the prebaked at 200° C. The coated film was 5000 Å in thickness. The solvent for coating was a mixed solution of 50% monochlorobenzene and 50% dioxane. Then, the φ-MAC resist added with zinc bromide in the amount of 3 wt% was spin-coated on the above film and prebaked. The thickness of the overlying film was 3000 Å. The solvent for this coating was methylisobutyl ketone. The electron beam with a 30 KV accelerating voltage was applied to the sample with 0.3 μm scanwidth. The exposure dose was 250 μC/cm$^2$.

Next, the sample was developed by the combined use of the developer of this invention and the conventional developer. That is, the sample was developed, for 30 sec., with a mixed solution of 1,4-dioxane, diisobutyl ketone, and acetic acid in the ratio of 30 to 70 to 1 and then developed, for 90 sec., with a mixed solution of 1,4-dioxane and diisobutyl ketone in the ratio of 30 to 70. As a result of this, a pattern of an undercut cross-sectional profile with a 0.38 μm aperture width and a 0.80 μm foot width was formed.

While the foregoing has described some embodiments using the developer added with carboxyl acid, the present invention is not limited specifically thereto but can be widely applied to the patterning process which employs various positive resist mixtures and utilizes the aforementioned Ionomer bonds. According to the present invention, in the patterning method in which a positive resist mixture of a resist having the carboxyl group in the side chain and an additive selected from oxides, halides, or organic acid salts of bivalent metals is coated on the surface of a substrate and baked, after which the coated film is irradiated by high-energy rays such as an electron beam, X-rays, or ultraviolet rays and the irradiated portion is dissolved by a developer composed of an organic solvent to thereby form a desired pattern, a thin film remaining undissolved by the developer can be removed by the use of a developer having carboxylic acid mixed in the organic solvent, ensuring the formation of a fine pattern with sharp edges.

Moreover, by using, in combination, the improved developer added with carboxylic acid according to the present invention and a conventional developer and by suitably selecting development the times for each developer, it is possible to enlarge the range over which the cross-sectional profile can be controlled. This method is particularly for controlling not only the aperture width but also the foot width in the semiconductor element manufacturing process employing the lift-off technique. For example, as described previously with regard to FIGS. 8 to 11, in a process in which a thin multilayer film is formed on a substrate, a resist pattern of an undercut profile in cross section is formed in this film, the film is etched using the pattern as a mask, metal is vapor deposited, and the pattern is lifted off, the dimension in which the thin film is worked depends upon the foot width of the pattern an the dimension in which the metal is worked depends upon the aperture width of the pattern. In such a case, the control of the cross-sectional profile by the combined use of the developer added with carboxyl acid according to the present invention and the conventional developer is particularly effective.

POSSIBILITY OF INDUSTRIAL APPLICATIONS

As described above, according to the resist mixture for use in the present invention, since the intermolecular crosslink density can be controlled by selecting the additive concentration and the heat treatment temperature, different sensitivities can be achieved for the same resist composition. Furthermore, since the resist mixture becomes insoluble in a solvent by heat treatment, resists of the same composition but different additive concentrations can be coated one on the other. This is effective for patterning which calls for control of the cross-sectional profile of the resist pattern after being developed. This also makes it possible to select, over a wide range, the molecular structure of a monomer unit copolymerizable with methacrylic acid, thereby allowing ease in achieving capabilities of the resist needed for the formation of a fine pattern, such as dry etching resistance, adhesion to the substrate, and so forth. According to the patterning method employing the positive resist mixture of the present invention, it is also possible to form an ultra-fine pattern and to control its cross-sectional profile over a wide range, thus permitting ultra-microfabrication of elements on a substrate. Ultra-microminiaturization and ultra-high integration of semiconductor integrated circuits is unavoidable for improvement of device performance and from the economical point of view, and improvement in the lithograph techniques is now being strongly demanded. It is considered that the present invention will meet such a demand and will be of great utility when employed in the manufacture of semiconductor integrated circuits. Moreover, it is considered that the present invention will contribute to the development of devices of GaAs and the like which employs the lift-off process as the basic step, and that the invention will be useful as well in the application to optical integrated circuits or superconductor elements such as a Josephson element and so on.

We claim:

1. A positive resist mixture which comprises an intermolecular cross-linked copolymer produced from a copolymer formed of 50 to 95 mole % phenyl methacrylate and 50 to 5 mole % methacrylic acid to which 0.1 to 5 weight % $ZnBr_2$ was added and the mixture thereafter subjected to heat treatment to form intermolecular cross-linking.

2. A positive resist mixture which comprises an intermolecular cross-linked copolymer produced from a copolymer which is polymethyl methacrylate-co-methacrylic acid containing a 30 mole % methacrylic acid unit to which 0.1 to 5 weight % $ZnBr_2$ was added and the mixture thereafter subjected to heat treatment to form intermolecular cross-linking.

3. The resist mixture of claim 1 wherein 0.3 weight % $ZnBr_2$ is used.

4. The resist mixture of claim 1 wherein 1 weight % $ZnBr_2$ is used.

5. The resist mixture of claim 1 wherein 3 weight % $ZnBr_2$ is used.

6. The resist mixture of claim 1 wherein the heat treatment comprises heating the mixture for about one hour at 140° to 200° C.

* * * * *